(12) United States Patent
Ikeda et al.

(10) Patent No.: US 11,456,329 B2
(45) Date of Patent: Sep. 27, 2022

(54) DISPLAY DEVICE

(71) Applicant: Japan Display Inc., Tokyo (JP)

(72) Inventors: Masanobu Ikeda, Tokyo (JP);
Yoshinori Aoki, Tokyo (JP); Akihiro Ogawa, Tokyo (JP); Yasuhiro Kanaya, Tokyo (JP)

(73) Assignee: Japan Display Inc., Tokyo (JP)

( * ) Notice: Subject to any disclaimer, the term of this patent is extended or adjusted under 35 U.S.C. 154(b) by 57 days.

(21) Appl. No.: 17/034,368

(22) Filed: Sep. 28, 2020

(65) Prior Publication Data

US 2021/0098527 A1    Apr. 1, 2021

(30) Foreign Application Priority Data

Sep. 30, 2019    (JP) .............................. JP2019-179255

(51) Int. Cl.
  *H01L 27/15*    (2006.01)
  *H01L 33/48*    (2010.01)
(52) U.S. Cl.
  CPC .......... *H01L 27/156* (2013.01); *H01L 33/486* (2013.01)
(58) Field of Classification Search
  CPC . H01L 25/075; H01L 25/0753; H01L 25/167; H01L 27/153; H01L 27/156; H01L 33/486; H01L 33/62
  See application file for complete search history.

(56) References Cited

U.S. PATENT DOCUMENTS

| | | |
|---|---|---|
| 2017/0211761 A1* | 7/2017 | Kuriki ..................... F21V 29/89 |
| 2017/0213502 A1 | 7/2017 | Henry et al. |
| 2020/0126477 A1 | 4/2020 | Henry et al. |

FOREIGN PATENT DOCUMENTS

| | | | | |
|---|---|---|---|---|
| JP | 2017-529557 A | | 10/2017 | |
| WO | WO-2014087723 A1 * | | 6/2014 | .......... B41F 23/0453 |

* cited by examiner

*Primary Examiner* — Sue A Purvis
*Assistant Examiner* — Scott Stowe
(74) *Attorney, Agent, or Firm* — Michael Best & Friedrich LLP

(57) ABSTRACT

A display device, includes: a substrate; a plurality of pixels provided on the substrate; and a plurality of light emitting elements provided in each of the pixels. A first distance between a top surface of the substrate and one of the light emitting elements in a direction perpendicular to the top surface of the substrate, in a center portion of a display region of the substrate, is different from a second distance between the top surface of the substrate and another one of the light emitting elements in the direction perpendicular to the top surface of the substrate, in a periphery portion of the display region.

16 Claims, 14 Drawing Sheets

DISPLAY DEVICE

CROSS-REFERENCE TO RELATED APPLICATION

This application claims priority from Japanese Application No. 2019-179255, filed on Sep. 30, 2019, the contents of which are incorporated by reference herein in its entirety.

BACKGROUND

1. Technical Field

The present disclosure relates to a display device.

2. Description of the Related Art

In recent years, a display using a micro light emitting diode (micro LED) as a display element has been attracting attention (for example, Japanese Unexamined Patent Application Publication No. 2017-529557). A plurality of the light emitting diodes are mounted on a flat surface of an array substrate (a driver backplane in Japanese Unexamined Patent Application Publication No. 2017-529557).

In the display using the micro light emitting diodes, excellent display characteristics such as a wide viewing angle and a high luminance have been demanded.

SUMMARY

A display device according to an embodiment of the present disclosure includes a substrate, a plurality of pixels provided on the substrate, and a plurality of light emitting elements provided in each of the pixels. A first distance between a top surface of the substrate and one of the light emitting elements in a direction perpendicular to the top surface of the substrate, in a center portion of a display region of the substrate, is different from a second distance between the top surface of the substrate and another one of the light emitting elements in the direction perpendicular to the top surface of the substrate, in a periphery portion of the display region.

A display device according to an embodiment of the present disclosure includes a substrate, a plurality of pixels provided on the substrate, and a plurality of light emitting elements provided in each of the pixels. An absolute value of a second angle formed by a direction parallel to a top surface of the substrate and a bottom surface of one of the light emitting elements, in a periphery portion of a display region of the substrate, is greater than an absolute value of a first angle formed by the direction parallel to the top surface of the substrate and a bottom surface of another one of the light emitting elements, in a center portion of the display region.

DETAILED DESCRIPTION

Figure 1:
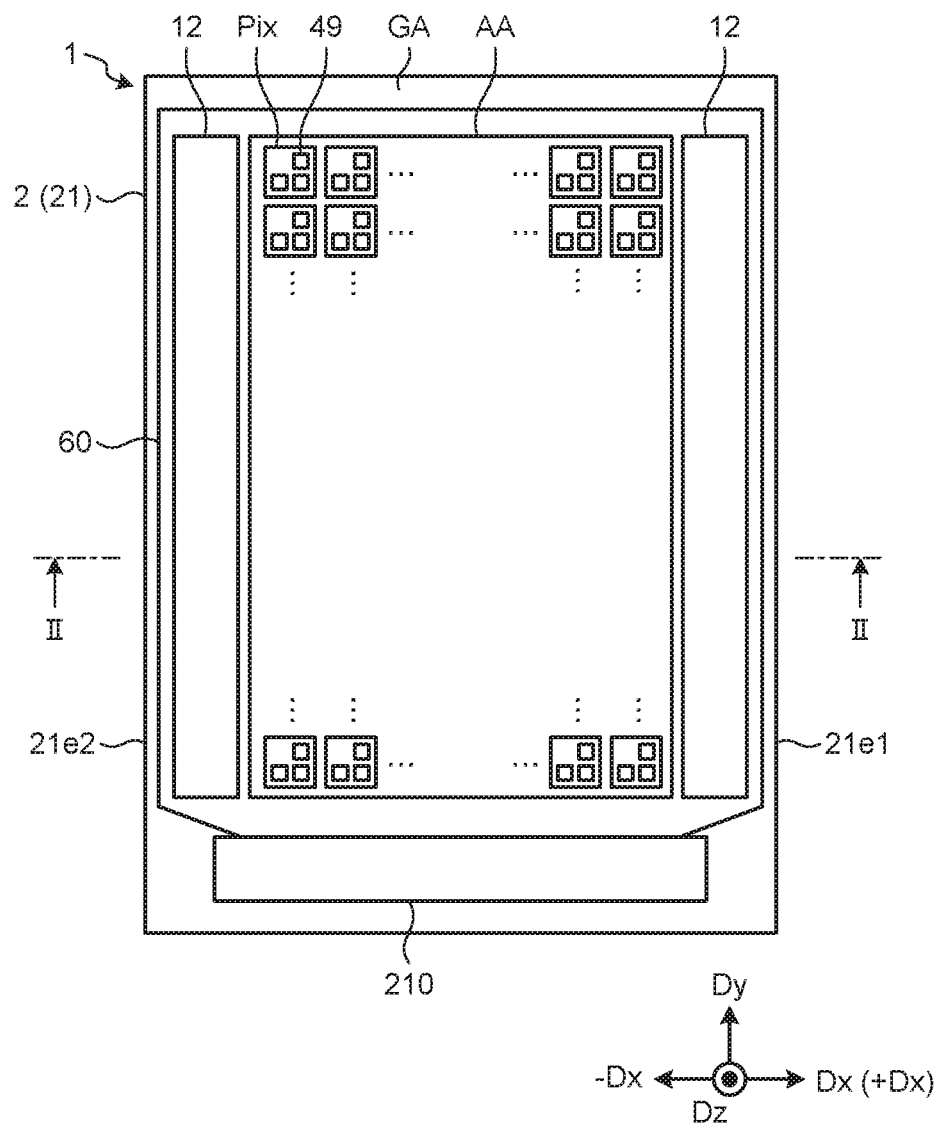
FIG. 1 is a plan view schematically illustrating a display device according to a first embodiment.

Hereinafter, modes for carrying out the present disclosure (embodiments) will be described in detail with reference to the accompanying drawings. It is not intended that the present disclosure be limited by what has been described in the following embodiments. The components described below include components that can be easily assumed by those skilled in the art, and components that are substantially the same as those components. The components described below can be combined with one another as appropriate. What is disclosed herein is merely an example, and the present disclosure naturally encompasses an appropriate modification maintaining the gist of the disclosure that is easily conceivable by those skilled in the art. To further clarify the description, a width, a thickness, a shape, and the like of each component may be schematically illustrated in the drawings as compared with an actual aspect. However, this is merely an example, and interpretation of the present disclosure is not limited thereto. The same element as that described in the drawing that has already been discussed is denoted by the same reference numeral throughout the present specification and the drawings, and the detailed description thereof may be omitted as appropriate.

In the present specification and claims, when the term "on" is simply used to express a state in which a structure is disposed on another structure, unless otherwise specified, the term includes both a case in which a structure is disposed directly on another structure so as to be in contact therewith, and a case in which a structure is disposed above another structure with a third structure interposed therebetween.

First Embodiment

FIG. 1 is a plan view schematically illustrating a display device according to a first embodiment. As illustrated in FIG. 1, a display device 1 includes an array substrate 2, a pixel Pix, a drive circuit 12, a drive integrated circuit (IC) 210, and cathode wiring 60. The array substrate 2 is a drive circuit substrate that drives a plurality of the pixels Pix, and may also be referred to as a backplane or an active matrix substrate. The array substrate 2 includes a substrate 21, a plurality of transistors, a plurality of capacitors, various types of wiring, and the like. Although not specifically illustrated, a flexible print circuit (FPC) for supplying a control signal and electric power to drive the drive circuit 12 and the drive IC 210, or the like may be coupled to the array substrate 2.

As illustrated in FIG. 1, the display device 1 includes a display region AA and a peripheral region GA. The display region AA is arranged so as to overlap with the pixels Pix, and is a region for displaying an image. The peripheral region GA is a region that does not overlap with the pixels Pix, and is arranged outside of the display region AA.

The pixels Pix are disposed in the display region AA of the substrate 21 in a first direction Dx and a second direction Dy. The first direction Dx and the second direction Dy are directions parallel to the top surface of the substrate 21. The first direction Dx is orthogonal to the second direction Dy. However, the first direction Dx may intersect with the second direction Dy in a non-orthogonal manner. A third direction Dz is a direction orthogonal to the first direction Dx and the second direction Dy. For example, the third direction Dz corresponds to the normal direction of the substrate 21. Hereinafter, a plan view illustrates a positional relation when viewed from the third direction Dz.

The drive circuit 12 is a circuit that drives a plurality of gate lines on the basis of various control signals from the drive IC 210 or the outside. The drive circuit 12 sequentially or simultaneously selects the gate lines, and supplies a gate drive signal to the selected gate lines. Consequently, the drive circuit 12 selects the pixels Pix coupled to the gate lines.

The drive IC 210 is a circuit for controlling the display of the display device 1. The drive IC 210 is mounted on the peripheral region GA of the substrate 21 as a chip on glass (COG). However, it is not limited thereto, and the drive IC 210 may also be mounted on a flexible print substrate or a rigid substrate coupled to the peripheral region GA of the substrate 21 as a chip on film (COF).

The cathode wiring 60 is provided on the peripheral region GA of the substrate 21. The cathode wiring 60 surrounds the pixels Pix in the display region AA and the drive circuit 12 in the peripheral region GA. Cathodes of a plurality of light emitting elements 3 are electrically coupled to the common cathode wiring 60. A fixed potential (for example, a ground potential) is supplied to the cathodes. More specifically, a cathode terminal 32 of each of the light emitting elements 3 (see FIG. 4) is coupled to the cathode wiring 60 via a cathode electrode 22.

Figure 2:
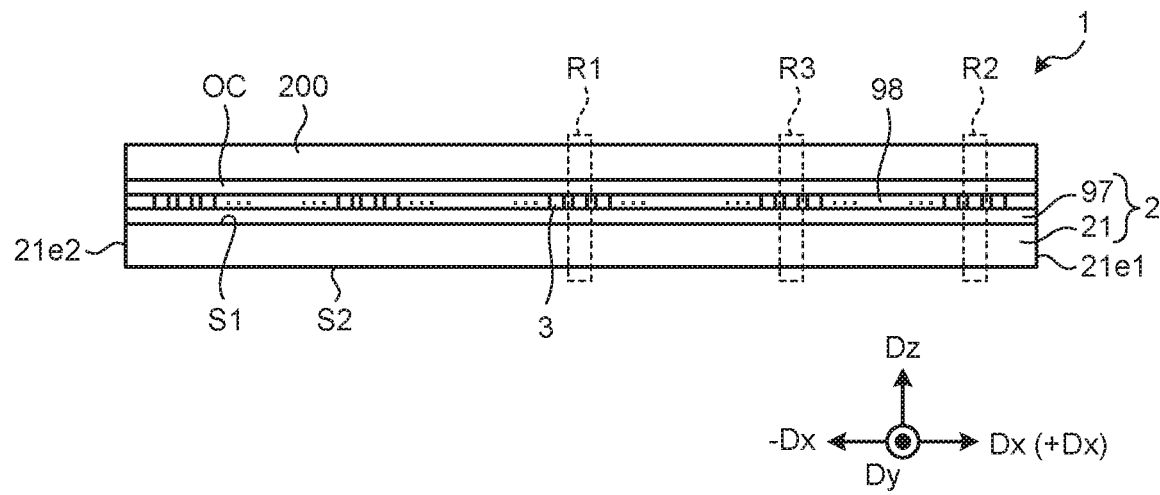
FIG. 2 is a sectional view cut along a line II-II' in FIG. 1.

FIG. 2 is a sectional view cut along a line II-II' in FIG. 1. As illustrated in FIG. 2, the light emitting elements 3 are disposed on the array substrate 2. An overcoat layer OC and a cover substrate 200 cover the cathode electrode 22 (see FIG. 4) coupled to the light emitting elements 3. For example, the overcoat layer OC is a layered product of a silicon nitride film and an organic insulation film. The cover substrate 200 is a protection member for protecting the light emitting elements 3 and the array substrate 2. The cover substrate 200 is a translucent glass substrate or resin substrate. The overcoat layer OC and the cover substrate 200 are not necessarily required.

In the present embodiment, the substrate 21 in the array substrate 2 is a planar member, and has a flat first surface S1 and a flat second surface S2. The light emitting elements 3 are mounted on the first surface S1 side. The second surface S2 is a surface on the side opposite to the first surface S1. Between the ends of the substrate 21 that face each other in the first direction Dx, a first end 21e1 is an end located at the right side in FIG. 2, and a second end 21e2 is an end located at the left side in FIG. 2. In the following explanation, a direction from the second end 21e2 toward the first end 21e1 may be referred to as a +Dx direction, and a direction from the first end 21e1 toward the second end 21e2 may be referred to as a −Dx direction.

In the following explanation, in the display region AA, a first region R1, a second region R2, and a third region R3 are regions separately aligned in the first direction Dx. The first region R1, the second region R2, and the third region R3 each include at least one or more light emitting elements 3. The first region R1 is a region in the center portion in the first direction Dx, and is a region including a middle point between the first end 21e1 and the second end 21e2. The second region R2 is a region in the periphery portion of the display region AA, and is a region closer to the first end 21e1 than the first region R1. The light emitting element 3 is arranged between the second region R2 and the first end 21e1. However, it is not limited thereto. The second region R2 may include the outermost light emitting element 3 in the display region AA. The third region R3 is a region between the first region R1 and the second region R2.

Figure 3:
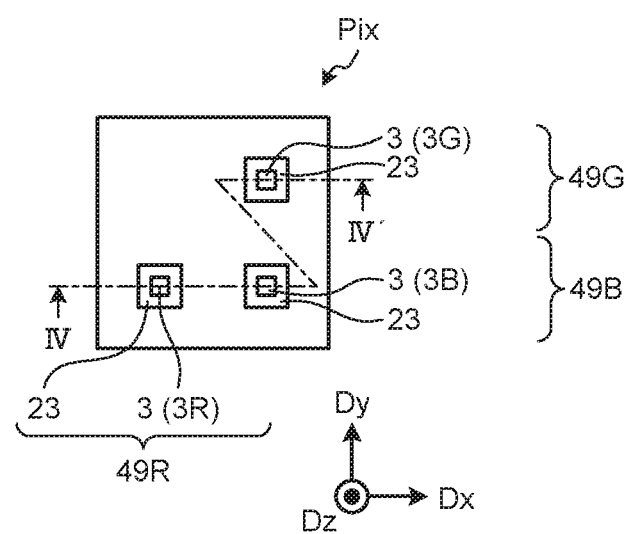
FIG. 3 is a plan view illustrating a plurality of sub-pixels.

FIG. 3 is a plan view illustrating a plurality of sub-pixels. As illustrated in FIG. 3, a single pixel Pix includes a plurality of sub-pixels 49. For example, the pixel Pix includes a first sub-pixel 49R, a second sub-pixel 49G, and a third sub-pixel 49B. The first sub-pixel 49R displays red, which is a primary color, as a first color. The second sub-pixel 49G displays green, which is a primary color, as a second color. The third sub-pixel 49B displays blue, which is a primary color, as a third color. As illustrated in FIG. 3, in a single pixel Pix, the first sub-pixel 49R and the third sub-pixel 49B are aligned in the first direction Dx. The second sub-pixel 49G and the third sub-pixel 49B are aligned in the second direction Dy. The first color, the second color, and the third color are not limited to red, green, and blue, and may be any color such as a complementary color. In the following, if the first sub-pixel 49R, the second sub-pixel 49G, and the third sub-pixel 49B need not be distinguished from each other, the first sub-pixel 49R, the second sub-pixel 49G, and the third sub-pixel 49B are simply referred to as a sub-pixel 49.

Each sub-pixel 49 includes the light emitting element 3 and an anode electrode 23. The display device 1 displays an image when the light emitting elements 3R, 3G, and 3B of the first sub-pixel 49R, the second sub-pixel 49G, and the third sub-pixel 49B emit different light (for example, light in red, green, or blue). The light emitting element 3 is provided in each of the sub-pixels 49. In plan view, the light emitting element 3 is a light emitting diode (LED) chip having the size of about 3 µm to 300 µm. Although not strictly defined, the LED chip the size of which is less than 100 µm is referred to as a micro LED. The display device 1 that has a micro LED in each pixel may also be referred to as a micro LED display device. The term "micro" in the micro LED does not limit the size of the light emitting element 3.

The light emitting elements 3 may also emit light in four or more different colors. The arrangement of the sub-pixels 49 is not limited to the configuration illustrated in FIG. 3. For example, the first sub-pixel 49R may be adjacent to the second sub-pixel 49G in the first direction Dx. The first sub-pixel 49R, the second sub-pixel 49G, and the third sub-pixel 49B may be repeatedly disposed in the first direction Dx in this order.

Figure 4:
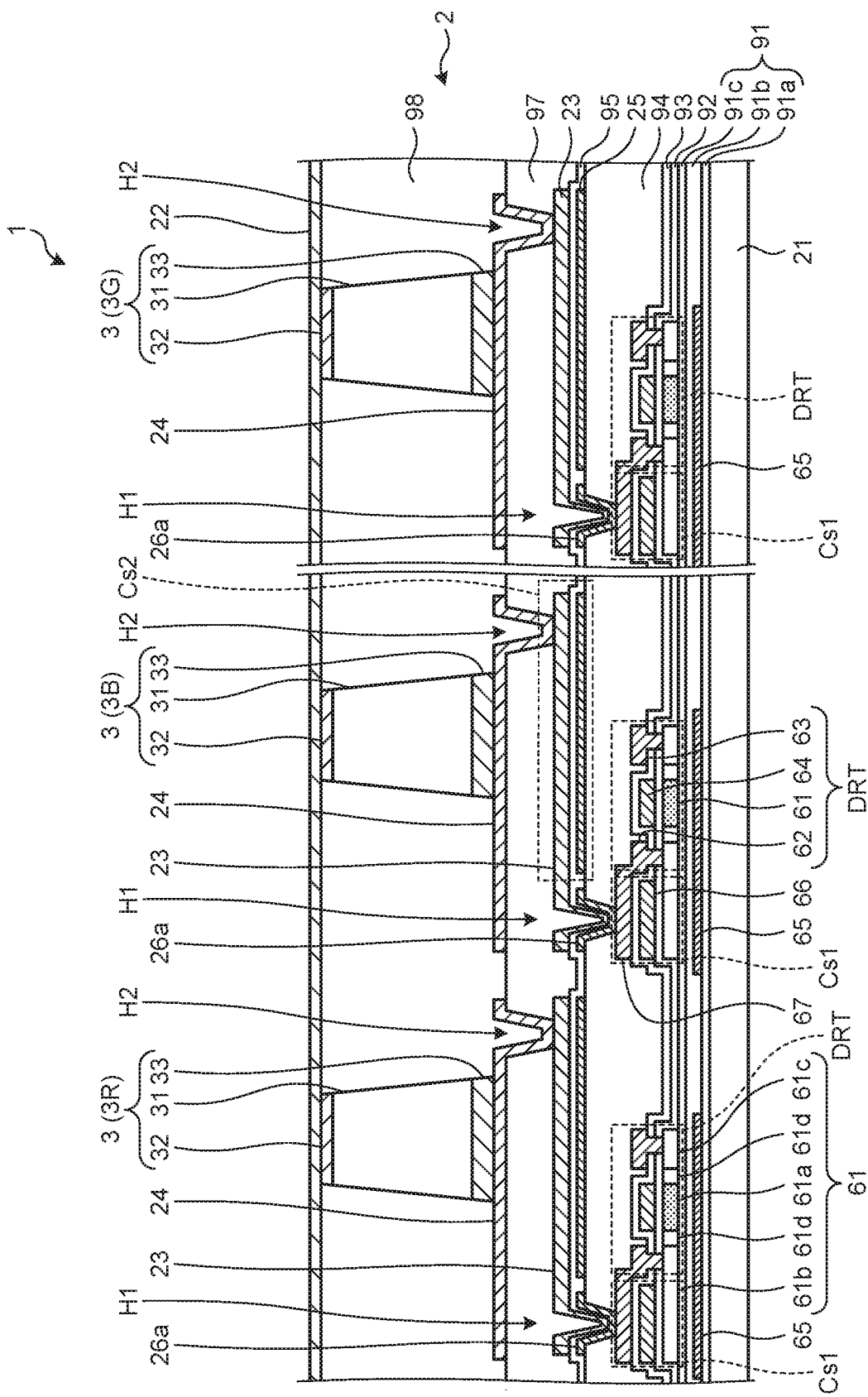
FIG. 4 is a sectional view cut along a line IV-IV' in FIG. 3.

Next, a sectional configuration of the display device 1 will be described. FIG. 4 is a sectional view cut along a line IV-IV' in FIG. 3. As illustrated in FIG. 4, the light emitting elements 3 are provided on the array substrate 2. The array substrate 2 includes the substrate 21, the anode electrode 23, a mounting electrode 24, a counter electrode 25, a couple electrode 26a, various transistors, various types of wiring, and various insulation films.

The substrate 21 is an insulation substrate. For example, the substrate 21 is formed of a glass substrate such as quartz and alkali-free glass, or a resin substrate such as polyimide. When a flexible resin substrate is used for the substrate 21, the display device 1 may be configured as a sheet display. The substrate 21 may also be formed of another resin material, in addition to polyimide.

In the present specification, in the direction perpendicular to the top surface of the substrate 21, the direction from the substrate 21 toward the light emitting elements 3 is referred to as an "upward direction" or simply "above". The direction from the light emitting elements 3 toward the substrate 21 is referred to as a "downward direction" or simply "below".

An undercoat film 91 is provided on the substrate 21. For example, the undercoat film 91 has a three-layered structure including insulation films 91a, 91b, and 91c. The insulation film 91a is a silicon oxide film, the insulation film 91b is a silicon nitride film, and the insulation film 91c is a silicon oxide film. The lowermost insulation film 91a is provided to enhance the adhesion between the substrate 21 and the undercoat film 91. The middle insulation film 91b is provided as a block film against moisture and impurities from the outside. The uppermost insulation film 91c is provided as a block film for preventing hydrogen atoms contained in the silicon nitride film of the insulation film 91b from diffusing to a semiconductor layer 61 side.

The structure of the undercoat film 91 is not limited to that illustrated in FIG. 4. For example, the undercoat film 91 may be a single-layered film, a double-layered film, or may have four layers or more. When the substrate 21 is a glass substrate, a silicon nitride film may be directly formed on the substrate 21, because the adhesion property of the silicon nitride film is relatively good.

A shielding film 65 is provided on the insulation film 91a. The shielding film 65 is provided between the semiconductor layer 61 and the substrate 21. The shielding film 65 prevents light from entering into a channel region 61a of the semiconductor layer 61 from the substrate 21 side. The shielding film 65 can also give a back gate effect to a drive transistor DRT, by forming the shielding film 65 with a conductive material and applying a predetermined potential thereto. The shielding film 65 may also be provided on the substrate 21, and the insulation film 91a may be provided so as to cover the shielding film 65.

The drive transistor DRT is provided on the undercoat film 91. In FIG. 4, a single drive transistor DRT is illustrated corresponding to the light emitting element 3. However, a plurality of transistors that form a pixel circuit may also be provided corresponding to a single light emitting element 3.

The drive transistor DRT includes a semiconductor layer 61, a source electrode 62, a drain electrode 63, and a gate electrode 64. The semiconductor layer 61 is provided on the undercoat film 91. For example, the semiconductor layer 61 is formed of polysilicon. However, it is not limited thereto, and the semiconductor layer 61 may also be formed of a microcrystalline oxide semiconductor, an amorphous oxide semiconductor, low-temperature polysilicon, and the like. Only an n-type TFT is illustrated as the drive transistor DRT. However, a p-type TFT may also be formed at the same time. In the n-type TFT, the semiconductor layer 61 includes the channel region 61a, a source region 61b, a drain region 61c, and a low-concentration impurity region 61d. The low-concentration impurity region 61d is provided between the channel region 61a and the source region 61b, and also between the channel region 61a and the drain region 61c.

A gate insulation film 92 is provided on the undercoat film 91 so as to cover the semiconductor layer 61. For example, the gate insulation film 92 is a silicon oxide film. The gate electrode 64 is provided on the gate insulation film 92. First wiring 66 is formed on the same layer as that of the gate electrode 64. For example, the gate electrode 64 and the first wiring 66 are formed of molybdenum tungsten (MoW). In the example illustrated in FIG. 4, the drive transistor DRT has a top gate structure in which the gate electrode 64 is provided above the semiconductor layer 61. However, it is not limited thereto, and the drive transistor DRT may also have a bottom gate structure in which the gate electrode 64 is provided below the semiconductor layer 61. The drive transistor DRT may also have a dual gate structure in which the gate electrode 64 is provided both above and below the semiconductor layer 61.

An interlayer insulation film 93 is provided on the gate insulation film 92 so as to cover the gate electrode 64. For example, the interlayer insulation film 93 has a layered structure of a silicon nitride film and a silicon oxide film. The source electrode 62 and the drain electrode 63 are provided on the interlayer insulation film 93. The source electrode 62 is coupled to the source region 61b, via a contact hole provided on the gate insulation film 92 and the interlayer insulation film 93. The drain electrode 63 is coupled to the drain region 61c, via a contact hole provided on the gate insulation film 92 and the interlayer insulation film 93. Second wiring 67, which will be routing wiring, is coupled to the source electrode 62. For example, the source electrode 62, the drain electrode 63, and the second wiring 67 may have a three-layered structure of titan (Ti), aluminum (Al), and titan (Ti).

A part of the second wiring 67 is formed in a region overlapping with the first wiring 66. A capacitor Cs1 is formed by the first wiring 66 and the second wiring 67 that face each other with the interlayer insulation film 93 interposed therebetween. The first wiring 66 is formed in a region overlapping with a part of the semiconductor layer 61. The capacitor Cs1 also includes a capacitor formed by the semiconductor layer 61 and the first wiring 66 that face each other with the gate insulation film 92 interposed therebetween.

A first organic insulation film 94 is provided on the interlayer insulation film 93 so as to cover the drive transistor DRT and the second wiring 67. The first organic insulation film 94 is formed of an organic material such as photosensitive acryl. Compared to an inorganic insulation material formed by a chemical vapor deposition (CVD) and the like, the organic material such as photosensitive acryl is excellent in covering wiring steps and making the surface flat.

The counter electrode 25, a capacitor insulation film 95, and the anode electrode 23 are layered on the first organic insulation film 94 in this order. For example, the counter electrode 25 is formed of a translucent conductive material such as indium tin oxide (ITO). The couple electrode 26a is formed on the same layer as that of the counter electrode 25. The couple electrode 26a covers the inside of a contact hole H1 formed in the first organic insulation film 94, and is coupled to the second wiring 67 at the bottom of the contact hole H1.

The capacitor insulation film 95 covers the counter electrode 25 and the couple electrode 26a, and has an opening in a region overlapping with the contact hole H1. For example, the capacitor insulation film 95 is a silicon nitride film. The anode electrode 23 faces the counter electrode 25 with the capacitor insulation film 95 interposed therebetween. The anode electrode 23 is electrically coupled to the couple electrode 26a and the second wiring 67 via the contact hole H1. Consequently, the anode electrode 23 is electrically coupled to the drive transistor DRT. The anode electrode 23 has a layered structure of titan (Ti) and aluminum (Al). However, it is not limited thereto, and the anode electrode 23 may be made of a material containing at least one or more metals of molybdenum and titan. Alternatively, the anode electrode 23 may be made of alloy containing one or more of molybdenum and titan, or a translucent conductive material.

A capacitor Cs2 is formed between the anode electrode 23 and the counter electrode 25 that face each other with the capacitor insulation film 95 interposed therebetween. In a process of forming the anode electrode 23, the counter electrode 25 formed of ITO also functions as a barrier film for protecting various types of wiring such as the second wiring 67. While patterning the anode electrode 23, a part of the counter electrode 25 is exposed to the etching environment. However, by an annealing treatment performed between the formation of the counter electrode 25 and the formation of the anode electrode 23, the counter electrode 25 has a sufficient resistance against the etching of the anode electrode 23.

A second organic insulation film 97 is provided on the anode electrode 23. A contact hole H2 that reaches the anode electrode 23 is formed in the second organic insulation film 97. The second organic insulation film 97 is formed of an organic material the same as that of the first organic insulation film 94. The mounting electrode 24 is provided on the second organic insulation film 97, and is electrically coupled to the anode electrode 23 via the contact hole H2. Similar to the anode electrode 23, the mounting electrode 24 has a layered structure of titan and aluminum. However, the mounting electrode 24 may be formed of a conductive material different from that of the anode electrode 23. The second organic insulation film 97 may also be formed of an organic material different from that of the first organic insulation film 94.

The light emitting elements 3R, 3G, and 3B are mounted on the corresponding mounting electrodes 24. Each light emitting element 3 is mounted on the mounting electrode 24 so that an anode terminal 33 is bought into contact with the mounting electrode 24. A joining member 24a between the anode terminal 33 of each light emitting element 3 and the mounting electrode 24 is not particularly limited, as long as the joining member 24a can ensure satisfactory conduction between the anode terminal 33 and the mounting electrode 24, and does not damage a material formed on the array substrate 2. A barrier metal (such as platinum (Pt), nickel (Ni), and titanium tungsten (TiW)) may also be provided between the joining member 24a and the anode terminal 33, or between the joining member 24a and the mounting electrode 24. For example, the anode terminal 33 and the mounting electrode 24 may be joined to each other by a reflow process using a low-temperature melting solder. The anode terminal 33 and the mounting electrode 24 may also be sintered and bonded, after mounting the light emitting element 3 on the array substrate 2 via a conductive paste.

In this process, the light emitting element 3 may also be directly mounted on the anode electrode 23, without providing the second organic insulation film 97 and the mounting electrode 24 on the array substrate 2. However, when the second organic insulation film 97 and the mounting electrode 24 are provided, it is possible to prevent the capacitor insulation film 95 from being damaged by the force applied when the light emitting element 3 is mounted. In other words, it is possible to prevent dielectric breakdown from occurring between the anode electrode 23 and the counter electrode 25 that form the capacitor Cs2.

The light emitting element 3 includes a semiconductor layer 31, the cathode terminal 32, and the anode terminal 33. The semiconductor layer 31 may have a layered structure of an n-type cladding layer, an active layer, and a p-type cladding layer. For example, the semiconductor layer 31 may be a compound semiconductor formed of gallium nitride (GaN), aluminum indium phosphide (AlInP), indium gallium nitride (InGaN), and the like. In the semiconductor layer 31, the light emitting elements 3R, 3G, and 3B may be formed of different materials. The active layer may have a multiple quantum well structure (MQW structure) in which a well layer and a barrier layer formed of several atomic layers are periodically layered to increase efficiency. The light emitting element 3 may be configured by forming the semiconductor layer 31 on a semiconductor substrate. The light emitting element 3 may also be configured by mounting an LED chip including the light emitting element 3 on the array substrate 2, in addition to mounting a single light emitting element 3 on the array substrate 2.

An element insulation film 98 is provided between the light emitting elements 3. The element insulation film 98 is formed of a resin material. The element insulation film 98 covers the side surface of the light emitting element 3. The cathode terminal 32 of the light emitting element 3 is exposed from the element insulation film 98. The element insulation film 98 is formed flat so that the upper surface of the element insulation film 98 and the upper surface of the cathode terminal 32 form the same surface. However, the upper surface of the element insulation film 98 and the upper surface of the cathode terminal 32 may be placed at different positions.

The cathode electrode 22 is electrically coupled to the light emitting elements 3 so as to cover the light emitting elements 3 and the element insulation film 98. More specifically, the cathode electrode 22 is provided across the upper surface of the element insulation film 98 and the upper surface of the cathode terminal 32. For example, the cathode electrode 22 may be formed of a translucent conductive material such as ITO. Consequently, it is possible to effectively extract the light emitted from the light emitting element 3 to the outside. The cathode electrode 22 is electrically coupled to the cathode terminal 32 of each of the light emitting elements 3 mounted on the display region AA. The cathode electrode 22 is a cathode contact part provided outside of the display region AA, and is coupled to the cathode wiring 60 provided on the array substrate 2 side.

The overcoat layer OC and the cover substrate 200 (see FIG. 2) are layered on the cathode electrode 22. In this manner, the display device 1 using the light emitting element 3 as a display element is formed. In the display device 1, according to the needs, a circular polarization plate, a touch panel, and the like may also be provided above the cathode electrode 22. In this example, the display device 1 has a face-up structure in which the upper portion of the light emitting element 3 is coupled to the cathode electrode 22. However, it is not limited thereto, and the display device 1 may also have what is called a face-down structure in which the lower portion of the light emitting element 3 is coupled to the anode electrode 23 and the cathode electrode 22.

Figure 5:
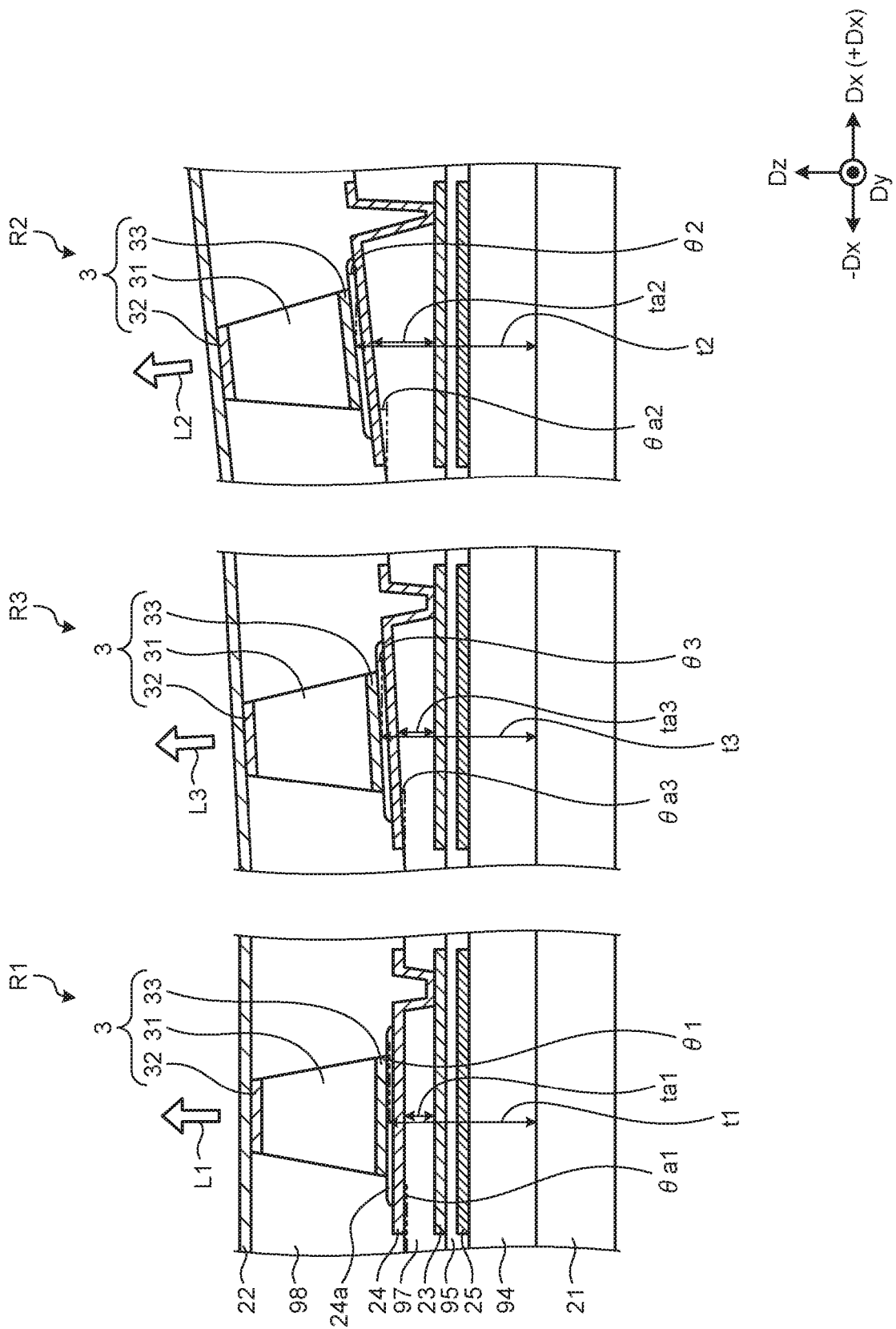
FIG. 5 is an enlarged sectional view of a first region, a second region, and a third region in FIG. 2.

Next, a relation between the position in the display region AA and the emission angle of the light emitting element 3 will be described in detail. FIG. 5 is an enlarged sectional view of a first region, a second region, and a third region in FIG. 2. In FIG. 5, to make the drawings easy to understand, the configuration between the substrate 21 in the array substrate 2 and the first organic insulation film 94 is omitted. However, the drive transistor DRT and various types of wiring are provided corresponding to the light emitting element 3 in each region. In FIG. 5 and the like, for easy understanding, the distribution of the thickness of the second organic insulation film 97 and the inclination of the light emitting element 3 is emphasized. In other words, the distribution of the thickness of the second organic insulation film 97 and the inclination of the light emitting element 3 may be smaller than that in the example illustrated in FIG. 5 and the like.

FIG. 5 illustrates a part of a region from the first region R1 that is located at the center portion of the display region AA in the first direction Dx, toward the +Dx direction. However, a region from the first region R1 toward the −Dx direction can also be explained by inverting the second region R2 and the third region R3 in the horizontal direction. In other words, the region in the −Dx direction has a structure in which the region in the +Dx direction is inverted with a virtual line parallel to the third direction Dz as a symmetrical axis.

As illustrated in FIG. 5, a first distance t1 between the top surface of the substrate 21 and the light emitting element 3 in the direction perpendicular to the top surface of the substrate 21, in the center portion (first region R1) of the display region AA of the substrate 21, is different from a second distance t2 between the top surface of the substrate 21 and the light emitting element 3 in the direction perpendicular to the top surface of the substrate 21, in the periphery portion (second region R2) of the display region AA. More specifically, the second distance t2 is greater than the first distance t1.

A third distance t3 between the top surface of the substrate 21 and the light emitting element 3 in the direction perpendicular to the top surface of the substrate 21, in the middle portion (third region R3) between the first region R1 and the second region R2 of the display region AA, is greater than the first distance t1, and is smaller than the second distance t2. In the present specification, the first distance t1, the second distance t2, and the third distance t3 are each a distance between the middle point of the bottom surface of the light emitting element 3 (bottom surface of the anode terminal 33) in the first direction Dx, and the substrate 21.

In the second region R2 and the third region R3, the bottom surface of the light emitting element 3 at the first end 21e1 side (+Dx direction) of the substrate 21 is inclined in a direction away from the substrate 21, than the bottom surface of the light emitting element 3 at the center portion side (−Dx direction) of the substrate 21. In other words, the light emitting elements 3 in the second region R2 and the third region R3 are arranged such that the direction of the polar angle 0 degrees is inclined in the −Dx direction with respect to the third direction Dz.

More specifically, an absolute value of a second angle θ2 formed by the direction parallel to the top surface of the substrate 21 and the bottom surface of the light emitting element 3 in the second region R2, is greater than an absolute value of a first angle θ1 formed by the direction parallel to the top surface of the substrate 21 and the bottom surface of the light emitting element 3 (bottom surface of the anode terminal 33) in the first region R1.

An absolute value of a third angle θ3 formed by the direction parallel to the top surface of the substrate 21 and the bottom surface of the light emitting element 3 in the third region R3, is greater than the absolute value of the first angle θ1 and is smaller than the absolute value of the second angle θ2. In the present specification, the first angle θ1, the second angle θ2, and the third angle θ3 are each an angle formed by a virtual line that passes through the middle point of the bottom surface of the light emitting element 3 (bottom surface of the anode terminal 33) in the first direction Dx and that extends in the direction parallel to the top surface of the substrate 21, and the bottom surface of the light emitting element 3.

In the present embodiment, the distribution of height positions and the distribution of inclination angles of the light emitting elements 3 can be implemented, by changing the thickness and inclination of the second organic insulation film 97 in each region. Thickness to of the second organic insulation film 97 is increased continuously from the first region R1 toward the second region R2 (first end 21e1 side of the substrate 21).

Thickness ta1 of the second organic insulation film 97 in the first region R1 is different from thickness ta2 of the second organic insulation film 97 in the second region R2. More specifically, the thickness ta2 of the second organic insulation film 97 is thicker than the thickness ta1. Thickness ta3 of the second organic insulation film 97 in the third region R3 is thicker than the thickness ta1, and is thinner than the thickness ta2.

The inclination of the top surface of the second organic insulation film 97 is gradually increased from the first region R1 toward the second region R2. In other words, the second organic insulation film 97 is provided so that an insulation film angle θa is increased continuously from the first region R1 toward the second region R2. More specifically, an absolute value of a second insulation film angle θa2 formed by the direction parallel to the top surface of the substrate 21 and the top surface of the second organic insulation film 97 in the second region R2, is greater than an absolute value of a first insulation film angle θa1 formed by the direction parallel to the top surface of the substrate 21 and the top surface of the second organic insulation film 97 in the first region R1.

An absolute value of a third insulation film angle θa3 of the second organic insulation film 97 in the third region R3 is greater than the absolute value of the first insulation film angle θa1, and is smaller than the absolute value of the second insulation film angle θa2.

The first insulation film angle θa1, the second insulation film angle θa2, and the third insulation film angle θa3 of the second organic insulation film 97 are equal to the first angle θ1, the second angle θ2, and the third angle θ3 of the light emitting elements 3. In other words, the thickness of the mounting electrode 24 and the joining member 24a is formed constant from the first region R1 toward the second region R2. In other words, the curvature of a virtual curve that joins the top surfaces of a plurality of the mounting electrodes 24 provided across the first region R1 and the second region R2 is formed greater than the curvature of the top surface of the substrate 21.

With such a configuration, the distances between the light emitting elements 3 and the substrate 21 are gradually increased from the first region R1 in the +Dx direction, and the light emitting elements 3 are arranged obliquely to the center portion side of the substrate 21. Light L1, L2, and L3 are light emitted from the light emitting elements 3 in the first region R1, the second region R2, and the third region R3, in the direction of the polar angle 0 degrees. The light L1 proceeds in the direction perpendicular to the top surface of the substrate 21. The light L2 and L3 bend in the −Dx direction side with respect to the direction perpendicular to the top surface of the substrate 21. The light L2 bends more in the −Dx direction side than the light L3.

In a region located in the −Dx direction side of the first region R1, the light emitting elements 3 are symmetrically arranged with respect to those in FIG. 5, and the light emitted from the light emitting elements 3 in the direction of the polar angle 0 degrees bends in the +Dx direction side with respect to the direction perpendicular to the top surface of the substrate 21.

Consequently, even when the light emitting elements 3 each having the emission angle characteristic based on the Lambertian characteristic are used, the display device 1 can improve the luminance of the center portion side of the flat substrate 21 in the first direction Dx. In other words, the display device 1 can suppress the light with a wide viewing angle emitted from the light emitting elements 3 located at the periphery portion, and improve the luminance in the direction more frequently observed by the observer. It is also possible to suppress the manufacturing cost of the display device 1, compared to when the luminance of the center portion side in the first direction Dx is improved by arranging the light emitting elements 3 each having a different emission angle characteristic in each region.

Changing the thickness and inclination angle of the second organic insulation film 97 in each region is not the only way to implement the height positions and inclination angles of the light emitting elements 3. The height positions and inclination angles of the light emitting elements 3 may also be implemented, by using an interlayer member between the drive transistor DRT and the light emitting elements 3. For example, the thickness and inclination angle of the first organic insulation film 94 may be changed, while keeping the thickness of the second organic insulation film 97 constant. The thickness and inclination angle of the mounting electrode 24 may also be changed in each region. In this case, the first insulation film angle θa1, the second insulation film angle θa2, and the third insulation film angle θa3 of the second organic insulation film 97 are different from the first angle θ1, the second angle θ2, and the third angle θ3 of the light emitting elements 3.

In FIG. 5, a part of the display region AA is enlarged, and a number of light emitting elements 3 are disposed in the first direction Dx. The distances between the top surface of the substrate 21 and the light emitting elements 3 in the direction perpendicular to the top surface of the substrate 21 change continuously from the first region R1 (center portion) toward the second region R2 (periphery portion) in the first direction Dx. The inclination angles of the light emitting elements 3 change continuously from the first region R1 (center portion) toward the second region R2 (periphery portion) in the first direction Dx. In this case, the distances between the light emitting elements 3 adjacent to each other in the first direction Dx and the substrate 21, and the angles formed by the light emitting elements 3 and the direction parallel to the substrate 21 may not be necessarily different. The light emitting elements 3 placed at the same distance from the substrate 21 may be provided adjacent to each other in the first direction Dx. Alternatively, the light emitting elements 3 in which the angles formed with the direction parallel to the substrate 21 are the same, may be provided adjacent to each other in the first direction Dx.

First Modification

Figure 6:
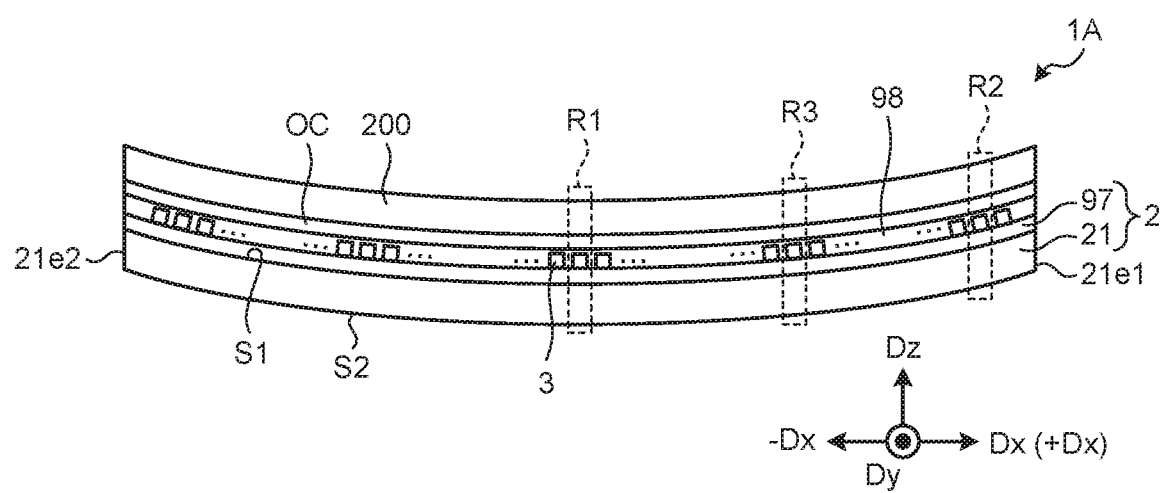
FIG. 6 is a sectional view schematically illustrating a display device according to a first modification of the first embodiment.

FIG. 6 is a sectional view schematically illustrating a display device according to a first modification of the first embodiment. In the following explanation, the same components as those described in the embodiment described above are denoted by the same reference numerals, and the repeated description thereof will be omitted.

As illustrated in FIG. 6, a display device 1A of the first modification is formed in a curved shape such that the first surface S1 of the substrate 21 has a concave shape. The first surface S1 of the substrate 21 is curved at a constant curvature from the first end 21e1 toward the second end 21e2. However, the shape of the substrate 21 is not limited thereto, and the substrate 21 may also have a configuration in which a plurality of portions having different curvatures are combined.

The light emitting elements 3 are disposed along the concave-shaped first surface S1. The overcoat layer OC and the cover substrate 200 that cover the light emitting elements 3 are also bent in a concave shape along the substrate 21. However, the cover substrate 200 may also be formed in a flat shape. In this case, the thickness of the overcoat layer OC is increased from the first end 21e1 and the second end 21e2 toward the center portion of the substrate 21, so as to fill between the cover substrate 200 and the cathode electrode 22 provided on the upper surfaces of the light emitting elements 3.

Figure 7:
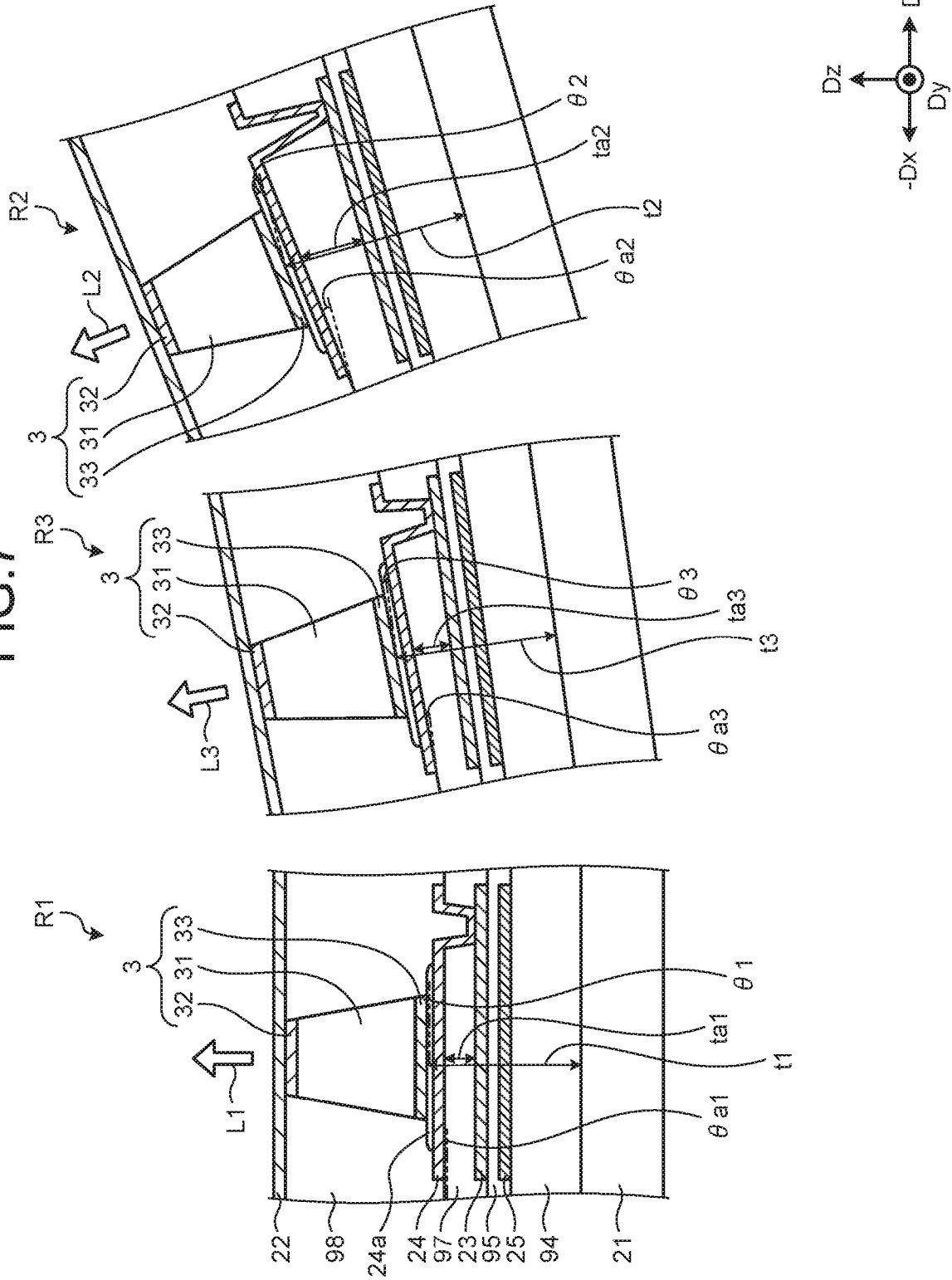
FIG. 7 is an enlarged sectional view of a first region, a second region, and a third region in FIG. 6.

FIG. 7 is an enlarged sectional view of the first region, the second region, and the third region in FIG. 6. As illustrated in FIG. 7, in the first modification also, the height positions and inclination angles of the light emitting elements 3 in the first region R1, the second region R2, and the third region R3 are the same as those in the first embodiment described above.

In other words, the second distance t2 between the top surface of the substrate 21 and the light emitting element 3 in the direction perpendicular to the top surface of the substrate 21 in the second region R2, is greater than the first distance t1 between the top surface of the substrate 21 and the light emitting element 3 in the direction perpendicular to the top surface of the substrate 21 in the first region R1. The third distance t3 between the top surface of the substrate 21 and the light emitting element 3 in the direction perpendicular to the top surface of the substrate 21 in the third region R3 is greater than the first distance t1, and is smaller than the second distance t2.

The absolute value of the second angle θ2 formed by the direction parallel to the top surface of the substrate 21 and the bottom surface of the light emitting element 3 in the second region R2, is greater than the absolute value of the first angle θ1 formed by the direction parallel to the top surface of the substrate 21 and the bottom surface of the light emitting element 3 (bottom surface of the anode terminal 33) in the first region R1. The absolute value of the third angle θ3 formed by the direction parallel to the top surface of the substrate 21 and the bottom surface of the light emitting element 3 in the third region R3, is greater than the absolute value of the first angle θ1, and is smaller than the absolute value of the second angle θ2.

The relation between the thicknesses ta1, ta2, and ta3 of the second organic insulation film 97, and the relation between the first insulation film angle θa1, the second insulation film angle θa2, and the third insulation film angle θa3 are the same as those in the first embodiment.

However, in the first modification, the substrate 21 is formed in a curved shape. Consequently, the direction perpendicular to the substrate 21 differs among the first region R1, the second region R2, and the third region R3. More specifically, the direction perpendicular to the top surface of the substrate 21 gradually bends in the −Dx direction with respect to the third direction Dz, from the first region R1 in the +Dx direction. The position of the top surface of the substrate 21 in the third direction Dz differs among the first region R1, the second region R2, and the third region R3. When the substrate 21 is curved, the third direction Dz is the direction perpendicular to the top surface of the substrate 21 in the first region R1.

Even when the height positions of the light emitting elements 3 and the inclination angles of the light emitting elements 3 with respect to the substrate 21 are kept constant, the light emitted from the light emitting element 3 provided in the periphery portion of the display region AA is directed in the −Dx direction side with respect to the third direction Dz, by simply bending the substrate 21 in a concave shape. As a result, it is possible to improve the luminance of the center portion in the first direction Dx.

In the first modification, compared to when the substrate 21 is simply bent in a concave shape, the light emitting elements 3 are arranged obliquely to the center portion side of the substrate 21 from the first region R1 in the +Dx direction. Consequently, compared to when the substrate 21 is simply bent in a concave shape, the light L2 and L3 bend in the −Dx direction side with respect to the direction perpendicular to the top surface of the substrate 21. The light L2 bends more in the −Dx direction side than the light L3. Consequently, the display device 1A can improve the luminance of the center portion in the first direction Dx, and can implement the emission angle characteristic that could not be implemented by the configuration in which the substrate 21 is simply bent in a concave shape.

Second Modification

Figure 8:
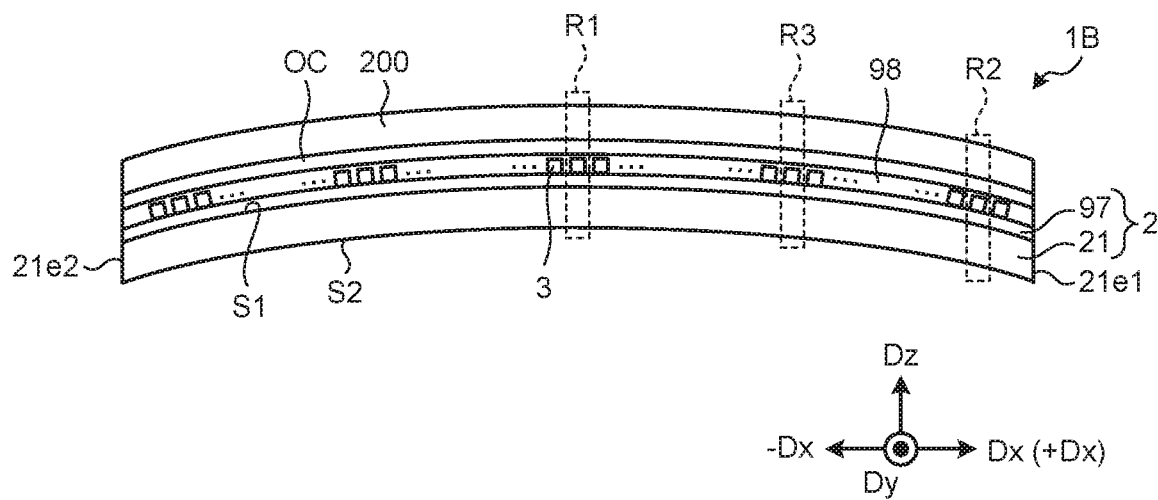
FIG. 8 is a sectional view schematically illustrating a display device according to a second modification of the first embodiment.

FIG. 8 is a sectional view schematically illustrating a display device according to a second modification of the first embodiment. As illustrated in FIG. 8, a display device 1B of the second modification is formed in a curved shape such that the first surface S1 of the substrate 21 has a convex shape. The first surface S1 of the substrate 21 is curved at a constant curvature from the first end 21e1 toward the second end 21e2.

The light emitting elements 3 are disposed along the convex-shaped first surface S1. The overcoat layer OC and the cover substrate 200 that cover the light emitting elements 3 are also bent in a convex shape along the substrate 21. However, the cover substrate 200 may also be formed in a flat shape. In this case, the thickness of the overcoat layer OC is increased from the center portion of the substrate 21 toward the first end 21e1 and the second end 21e2, so as to fill between the cover substrate 200 and the cathode electrode 22 provided on the upper surfaces of the light emitting elements 3.

Figure 9:
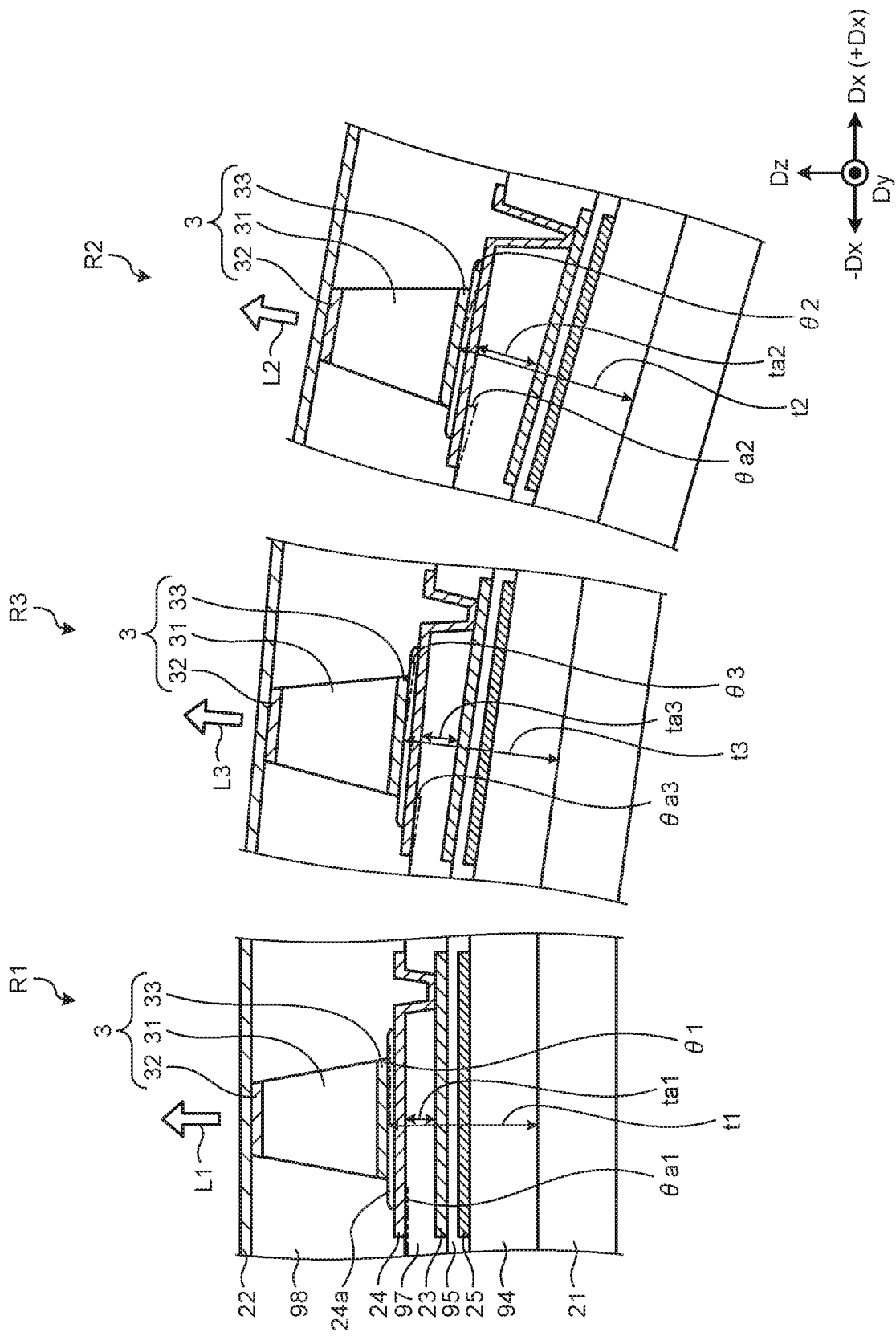
FIG. 9 is an enlarged sectional view of a first region, a second region, and a third region in FIG. 8.

FIG. 9 is an enlarged sectional view of a first region, a second region, and a third region in FIG. 8. As illustrated in FIG. 9, in the second modification also, the height positions and inclination angles of the light emitting elements 3 in the first region R1, the second region R2, and the third region R3 are the same as those in the first embodiment and the first modification described above.

In other words, the relation between the first distance t1, the second distance t2, and the third distance t3 between the top surface of the substrate 21 and the light emitting elements 3 in the first region R1, the second region R2, and the third region R3 is the same as that in the first embodiment and the first modification. The relation between the first angle θ1, the second angle θ2, and the third angle θ3 of the light emitting elements 3 is also the same as that in the first embodiment and the first modification.

The relation between the thicknesses ta1, ta2, and ta3 of the second organic insulation film 97, and the relation between the first insulation film angle θa1, the second insulation film angle θa2, and the third insulation film angle θa3 are also the same as those in the first embodiment and the first modification.

Because the substrate 21 is bent in a convex shape, the direction perpendicular to the top surface of the substrate 21 gradually bends in the +Dx direction side with respect to the third direction Dz, from the first region R1 in the +Dx direction. When the height positions of the light emitting elements 3 and the inclination angles of the light emitting elements 3 with respect to the substrate 21 are kept constant, the light emitted from the light emitting element 3 provided in the periphery portion of the display region AA is directed in the +Dx direction side with respect to the third direction Dz, by simply bending the substrate 21 in a convex shape. As a result, it is possible to improve the luminance in the direction parallel to the top surface of the substrate 21.

In the second modification, compared to when the substrate 21 is simply bent in a convex shape, the light emitting elements 3 are arranged obliquely to the center portion side of the substrate 21 from the first region R1 in the +Dx direction. Compared to when the substrate 21 is simply bent in a convex shape, the light L2 and L3 bend in the −Dx direction side with respect to the direction perpendicular to the top surface of the substrate 21. The light L2 bends more in the −Dx direction side than the light L3. Compared to when the substrate 21 is simply bent in a convex shape, the light L2 and L3 are directed in the direction parallel to the third direction Dz. Consequently, the display device 1B can control the distribution of the emission angle of light from the center portion to the periphery portion in the display region AA. Compared to when the substrate 21 is simply bent in a convex shape, the display device 1B can also improve the luminance of the center portion side of the substrate 21.

Second Embodiment

Figure 10:
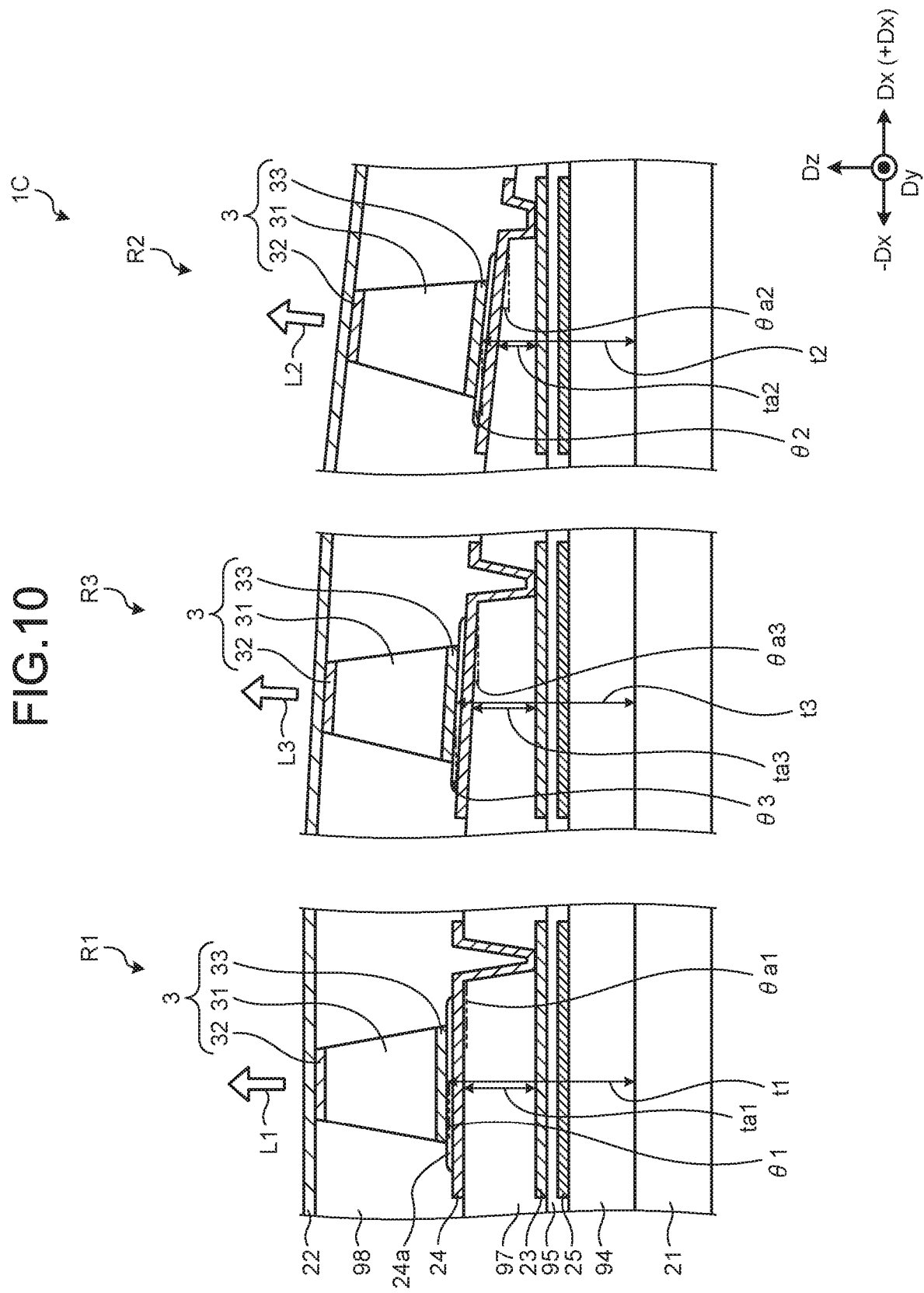
FIG. 10 is an enlarged sectional view of a first region, a second region, and a third region of a display device according to a second embodiment.

FIG. 10 is an enlarged sectional view of a first region, a second region, and a third region of a display device according to a second embodiment. In a display device 1C of the second embodiment, the substrate 21 is formed flat as that in FIG. 2.

As illustrated in FIG. 10, in the second embodiment, the light emitting elements 3 are inclined in a direction opposite to that in the first embodiment described above. More specifically, the first distance t1 between the top surface of the substrate 21 and the light emitting element 3 in the direction perpendicular to the top surface of the substrate 21 in the first region R1, is greater than the second distance t2 between the top surface of the substrate 21 and the light emitting element 3 in the direction perpendicular to the top surface of the substrate 21 in the second region R2.

The third distance t3 between the top surface of the substrate 21 and the light emitting element 3 in the direction perpendicular to the top surface of the substrate 21 in the third region R3, is smaller than the first distance t1, and is greater than the second distance t2.

In the second region R2 and the third region R3, the bottom surface of the light emitting element 3 at the center portion side (−Dx direction) of the substrate is inclined in the direction away from the substrate 21, than the bottom surface of the light emitting element 3 at the first end 21e1 side (+Dx direction) of the substrate 21. In other words, the light emitting elements 3 in the second region R2 and the third region R3 are arranged such that the direction of the polar angle 0 degrees is inclined in the +Dx direction side with respect to the third direction Dz.

More specifically, the absolute value of the second angle θ2 formed by the direction parallel to the top surface of the substrate 21 and the bottom surface of the light emitting element 3 in the second region R2, is greater than the absolute value of the first angle θ1 formed by the direction parallel to the top surface of the substrate 21 and the bottom surface of the light emitting element 3 (bottom surface of the anode terminal 33) in the first region R1.

The absolute value of the third angle θ3 formed by the direction parallel to the top surface of the substrate 21 and the bottom surface of the light emitting element 3 in the third region R3, is greater than the absolute value of the first angle θ1, and is smaller than the absolute value of the second angle θ2. When the direction parallel to the top surface of the substrate 21 is a reference virtual line, the inclination angles of the second angle θ2 and the third angle θ3 in the second embodiment are in the direction opposite to the second angle θ2 and the third angle θ3 in the first embodiment (for example, see FIG. 5).

The thickness ta of the second organic insulation film 97 is reduced continuously from the first region R1 toward the second region R2 (first end 21e1 side of the substrate 21).

More specifically, the thickness ta1 of the second organic insulation film 97 in the first region R1 is different from the thickness ta2 of the second organic insulation film 97 in the second region R2. The thickness ta2 of the second organic insulation film 97 is thinner than the thickness ta1. The thickness ta3 of the second organic insulation film 97 in the third region R3 is thinner than the thickness ta1, and is thicker than the thickness ta2.

The inclination of the top surface of the second organic insulation film 97 is gradually increased from the first region R1 toward the second region R2. In other words, the second organic insulation film 97 is provided so that the insulation film angle θa is increased continuously from the first region R1 toward the second region R2. More specifically, the absolute value of the second insulation film angle θa2 formed by the direction parallel to the top surface of the substrate 21 and the top surface of the second organic insulation film 97 in the second region R2, is greater than the absolute value of the first insulation film angle θa1 formed by the direction parallel to the top surface of the substrate 21 and the top surface of the second organic insulation film 97 in the first region R1. The absolute value of the third insulation film angle θa3 of the second organic insulation film 97 in the third region R3, is greater than the absolute value of the first insulation film angle θa1, and is smaller than the absolute value of the second insulation film angle θa2.

With such a configuration, the light emitting elements 3 are arranged obliquely to the end portion side (first end 21e1 side) of the substrate 21, from the first region R1 in the +Dx direction. The light L1, which is the light emitted from the light emitting element 3 in the first region R1 in the direction of the polar angle 0 degrees, proceeds in the direction perpendicular to the top surface of the substrate 21. Alternatively, the light L2 and L3 bend in the +Dx direction side with respect to the direction perpendicular to the top surface of the substrate 21. The light L2 bends more in the +Dx direction side than the light L3. In a region located in the −Dx direction side of the first region R1, the light emitting elements 3 are symmetrically arranged with respect to those in FIG. 10, and the light emitted from the light emitting element 3 in the direction of the polar angle 0 degrees bends in the −Dx direction side with respect to the direction perpendicular to the top surface of the substrate 21.

Consequently, even when the light emitting elements 3 each having an emission angle characteristic based on the Lambertian characteristic are used, the display device 1C can improve the luminance in the direction parallel to the top surface of the flat substrate 21 (+Dx direction and −Dx direction). In other words, the display device 1C can improve the viewing angle.

Third Modification

Figure 11:
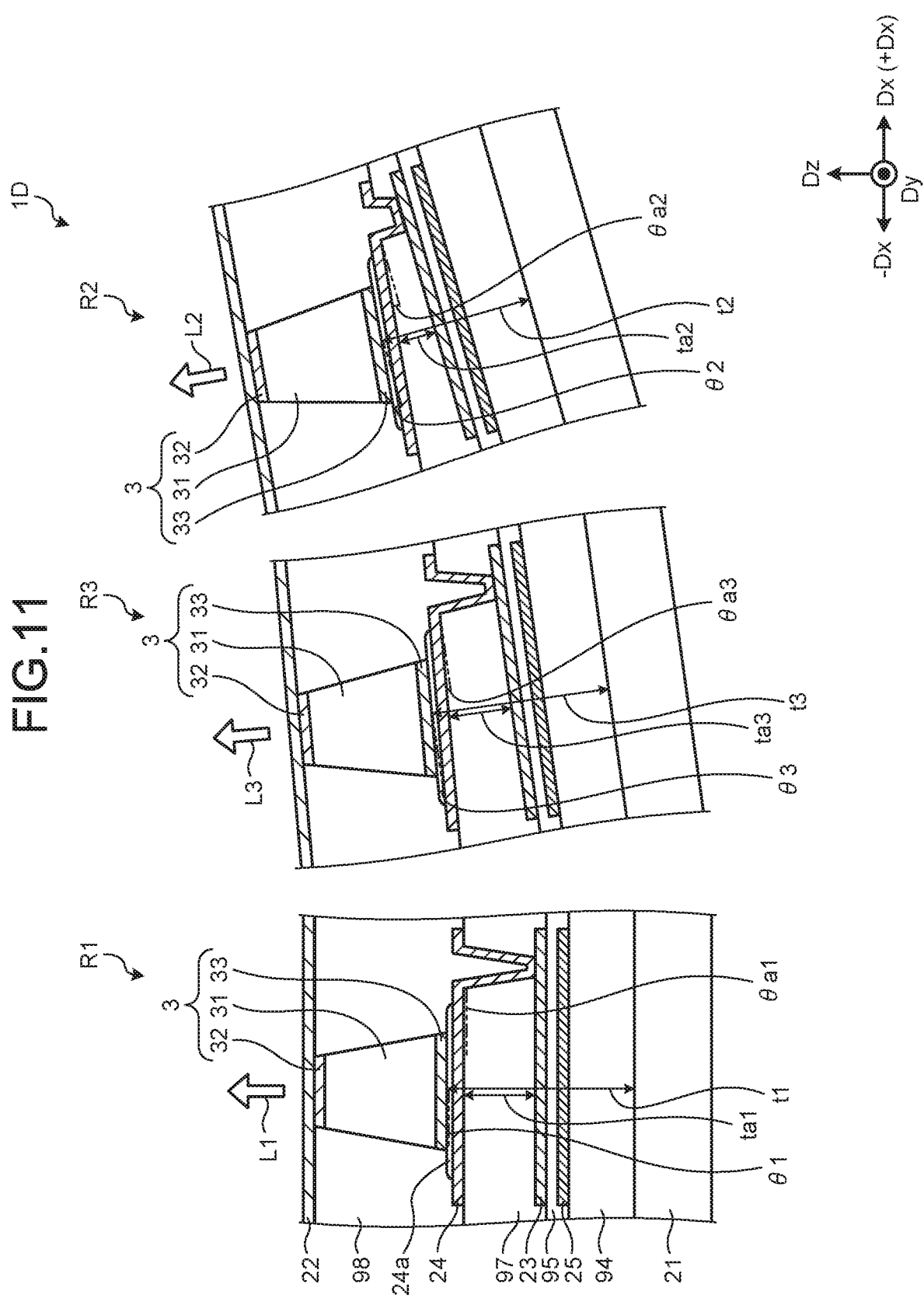
FIG. 11 is an enlarged sectional view of a first region, a second region, and a third region of a display device according to a third modification of the second embodiment.

FIG. 11 is an enlarged sectional view of a first region, a second region, and a third region of a display device according to a third modification of the second embodiment. In a display device 1D of the third modification, the substrate 21 is bent in a concave shape as in the first modification illustrated in FIG. 6 and FIG. 7.

As illustrated in FIG. 11, in the third modification, the relation between the first distance t1, the second distance t2, and the third distance t3 between the top surface of the substrate 21 and the light emitting elements 3 is the same as that in the second embodiment described above. The relation between the first angle θ1, the second angle θ2, and the third angle θ3 of the light emitting elements 3 is also the same as that in the second embodiment described above.

The relation between the thicknesses ta1, ta2, and ta3 of the second organic insulation film 97, and the relation between the first insulation film angle θa1, the second insulation film angle θa2, and the third insulation film angle θa3 are also the same as those in the second embodiment.

Because the substrate 21 is bent in a concave shape, when the height positions of the light emitting elements 3 and the inclination angles of the light emitting elements 3 with respect to the substrate 21 are kept constant, the luminance of the center portion in the first direction Dx is increased than that of the periphery portion. In the third modification, compared to when the substrate 21 is simply bent in a concave shape, the light emitting elements 3 are arranged obliquely to the end portion side (first end 21e1 side) of the substrate 21, from the first region R1 in the +Dx direction. Consequently, compared to when the substrate 21 is simply bent in a concave shape, the light L2 and L3 bend in the +Dx direction side with respect to the direction perpendicular to the top surface of the substrate 21. The light L2 bends more in the +Dx direction side than the light L3. The light L2 and L3 proceed toward the direction parallel to the third direction Dz. Consequently, the display device 1D can control the distribution of the emission angles of light from the center portion to the periphery portion in the display region AA. The display device 1D can implement the emission angle characteristic that could not be implemented by the configuration in which the substrate 21 is simply bent in a concave shape.

Fourth Modification

Figure 12:
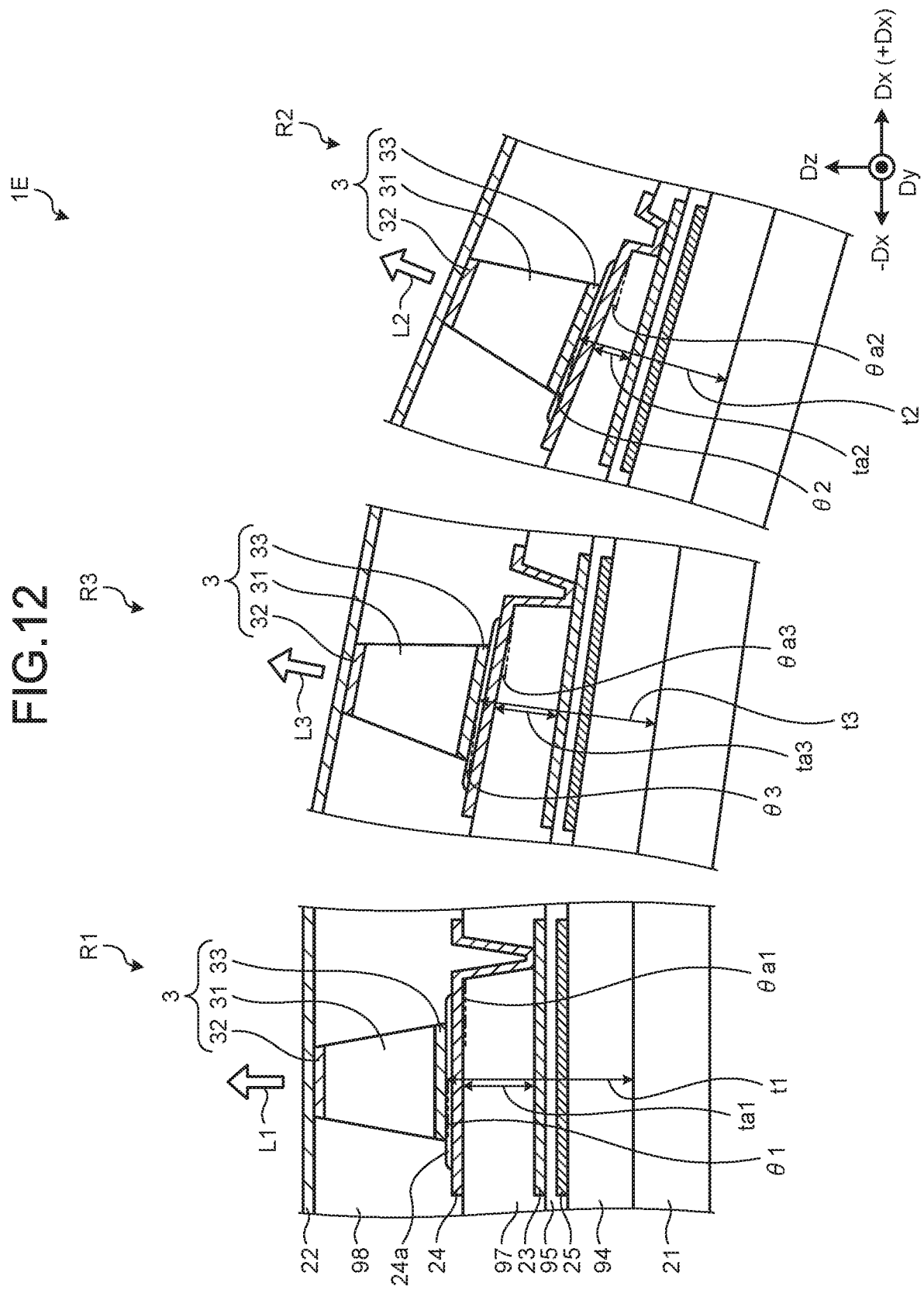
FIG. 12 is an enlarged sectional view of a first region, a second region, and a third region of a display device according to a fourth modification of the second embodiment.

FIG. 12 is an enlarged sectional view of a first region, a second region, and a third region of a display device according to a fourth modification of the second embodiment. In a display device 1E of the fourth modification, the substrate 21 is bent in a convex shape as in the second modification illustrated in FIG. 8 and FIG. 9.

As illustrated in FIG. 12, in the fourth modification, the relation between the first distance t1, the second distance t2, and the third distance t3 between the top surface of the substrate 21 and the light emitting elements 3 is the same as that in the second embodiment and the third modification described above. The relation between the first angle θ1, the second angle θ2, and the third angle θ3 of the light emitting elements 3 is also the same as that in the second embodiment and the third modification described above.

The relation between the thicknesses ta1, ta2, and ta3 of the second organic insulation film 97, and the relation between the first insulation film angle θa1, the second insulation film angle θa2, and the third insulation film angle θa3 are also the same as those in the second embodiment.

Because the substrate 21 is bent in a convex shape, it is possible to improve the luminance in the direction parallel to the top surface of the substrate 21, by simply bending the substrate 21 in a convex shape, while keeping the height positions of the light emitting elements 3 and the inclination angles of the light emitting elements 3 with respect to the substrate 21 constant.

In the fourth modification, compared to when the substrate 21 is simply bent in a convex shape, the light emitting elements 3 are arranged obliquely to the end portion side (first end 21e1 side) of the substrate 21, from the first region R1 in the +Dx direction. Consequently, compared to when the substrate 21 is simply bent in a convex shape, the light L2 and L3 bend in the +Dx direction side with respect to the direction perpendicular to the top surface of the substrate 21. The light L2 bends more in the +Dx direction side than the light L3. The light L2 and L3 are directed in the direction parallel to the top surface of the substrate 21. Consequently, the display device 1E can implement a wide viewing angle than when the substrate 21 is simply bent in a convex shape.

Third Embodiment

Figure 13:
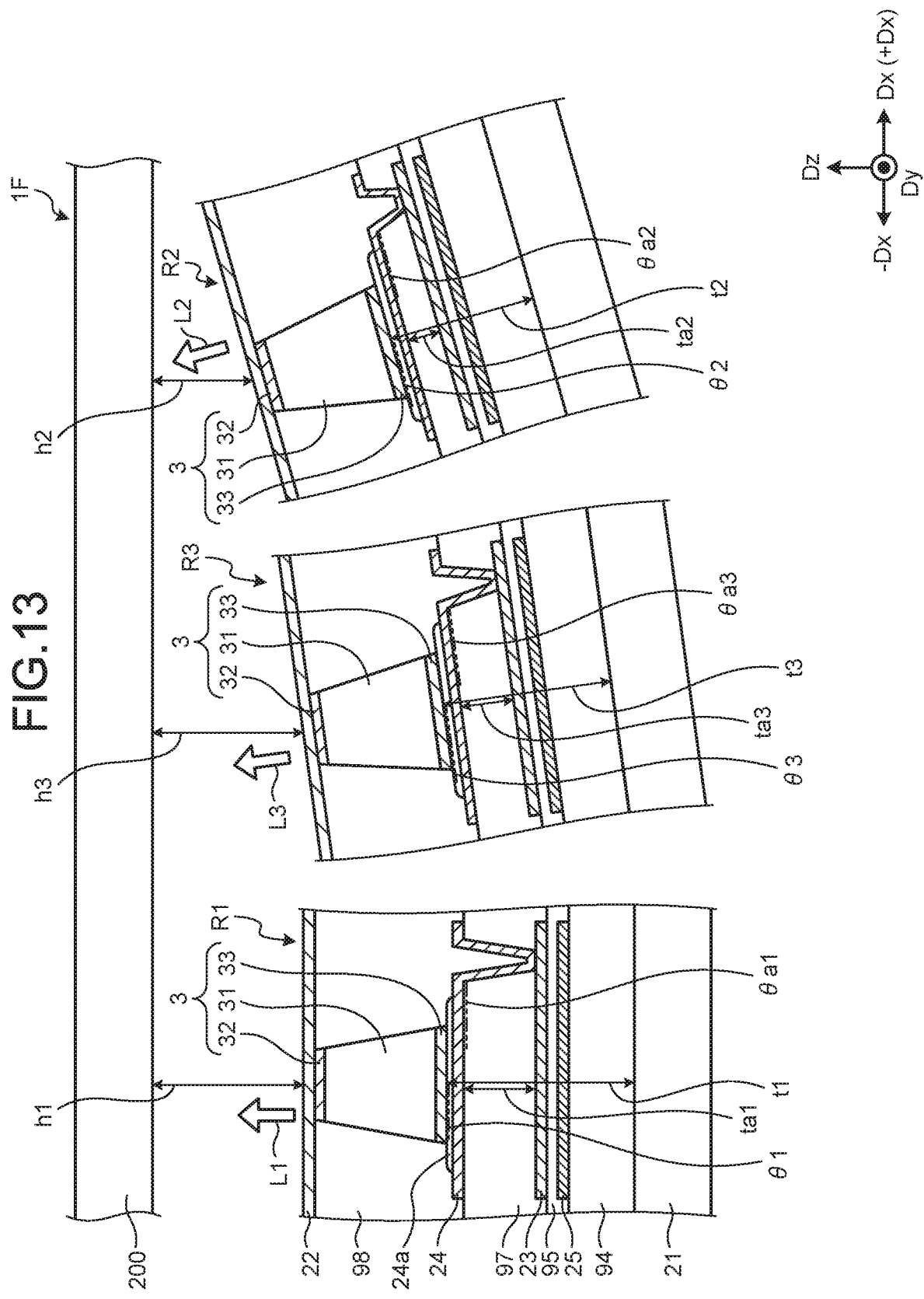
FIG. 13 is an enlarged sectional view of a first region, a second region, and a third region of a display device according to a third embodiment.

FIG. 13 is an enlarged sectional view of a first region, a second region, and a third region of a display device according to a third embodiment. As illustrated in FIG. 13, in a display device 1F of the third embodiment, the substrate 21 is bent in a concave shape as in the first modification illustrated in FIG. 6 and FIG. 7. The cover substrate 200 is formed flat.

In the third embodiment, in the first region R1, the second region R2, and the third region R3, the bottom surface of the light emitting element 3 (bottom surface of the anode terminal 33) and the top surface of the second organic insulation film 97 are provided in parallel to the top surface of the substrate 21. In other words, the first angle θ1, the second angle θ2, and the third angle θ3 are substantially equal, and all become 0 degrees. The first insulation film angle θa1, the second insulation film angle θa2, and the third insulation film angle θa3 are also substantially equal.

The relation between the height positions of the light emitting elements 3 is the same as that in the second embodiment described above. In other words, the first distance t1 in the first region R1 is greater than the second distance t2 in the second region R2. The third distance t3 in the third region R3 is smaller than the first distance t1, and is greater than the second distance t2. The thickness ta2 of the second organic insulation film 97 is thinner than the thickness ta1. The thickness ta3 of the second organic insulation film 97 in the third region R3 is thinner than the thickness ta1, and is thicker than the thickness ta2.

With such a configuration, compared to when the substrate 21 is bent in a concave shape, it is possible to suppress the fluctuation of gaps h1, h2, and h3 between the light emitting elements 3 and the cover substrate 200, by keeping the distances between the light emitting elements 3 and the top surface of the substrate 21 constant. More specifically, compared to when the substrate 21 is simply bent in a concave shape, the gap h2 and the gap h3 in the second region R2 and the third region R3 are increased, because the second distance t2 and the third distance t3 are reduced. In other words, the distances between the observer and the light emitting elements 3 become constant in the first region R1, the second region R2, and the third region R3. As a result, the display device 1F can suppress the luminance fluctuation within the surface of the display region AA.

Fifth Modification

Figure 14:
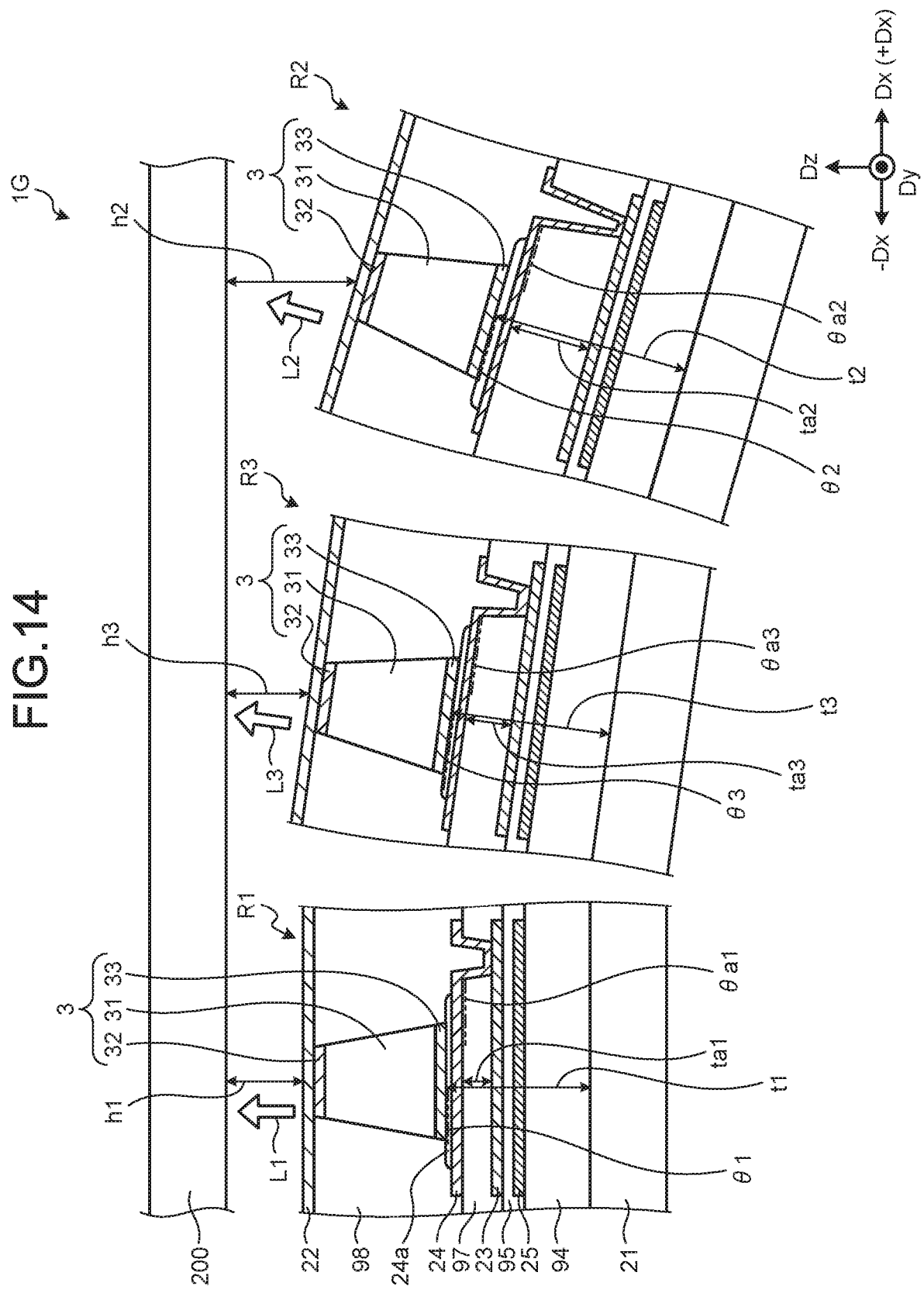
FIG. 14 is an enlarged sectional view of a first region, a second region, and a third region of a display device according to a fifth modification of the third embodiment.

FIG. 14 is an enlarged sectional view of a first region, a second region, and a third region of a display device according to a fifth modification of the third embodiment. As illustrated in FIG. 14, in a display device 1G of the fifth modification, the substrate 21 is bent in a convex shape as in the second modification illustrated in FIG. 8 and FIG. 9. The cover substrate 200 is formed flat.

In the fifth modification also, as in the third embodiment, in the first region R1, the second region R2, and the third region R3, the bottom surface of the light emitting element 3 (bottom surface of the anode terminal 33), and the top surface of the second organic insulation film 97 are provided parallel to the top surface of the substrate 21.

The relation between the height positions of the light emitting elements 3 is the same as that in the first embodiment described above. In other words, the second distance t2 in the second region R2 is greater than the first distance t1 in the first region R1. The third distance t3 in the third region R3 is greater than the first distance t1, and is smaller than the second distance t2. The thickness ta2 of the second organic insulation film 97 is thicker than the thickness ta1. The thickness ta3 of the second organic insulation film 97 in the third region R3 is thicker than the thickness ta1, and is thinner than the thickness ta2.

With such a configuration, compared to when the substrate 21 is simply bent in a convex shape, it is possible to suppress the fluctuation of the gaps h1, h2, and h3 between the light emitting elements 3 and the cover substrate 200, by keeping the distances between the light emitting elements 3 and the top surface of the substrate 21 constant. More specifically, compared to when the substrate 21 is simply bent in a convex shape, the gap h2 and the gap h3 in the second region R2 and the third region R3 are reduced, because the second distance t2 and the third distance t3 are increased. Consequently, the display device 1G can suppress the luminance fluctuation within the surface of the display region AA, because the distances between the observer and the light emitting elements 3 become constant in the first region R1, the second region R2, and the third region R3.

Fourth Embodiment

Figure 15:
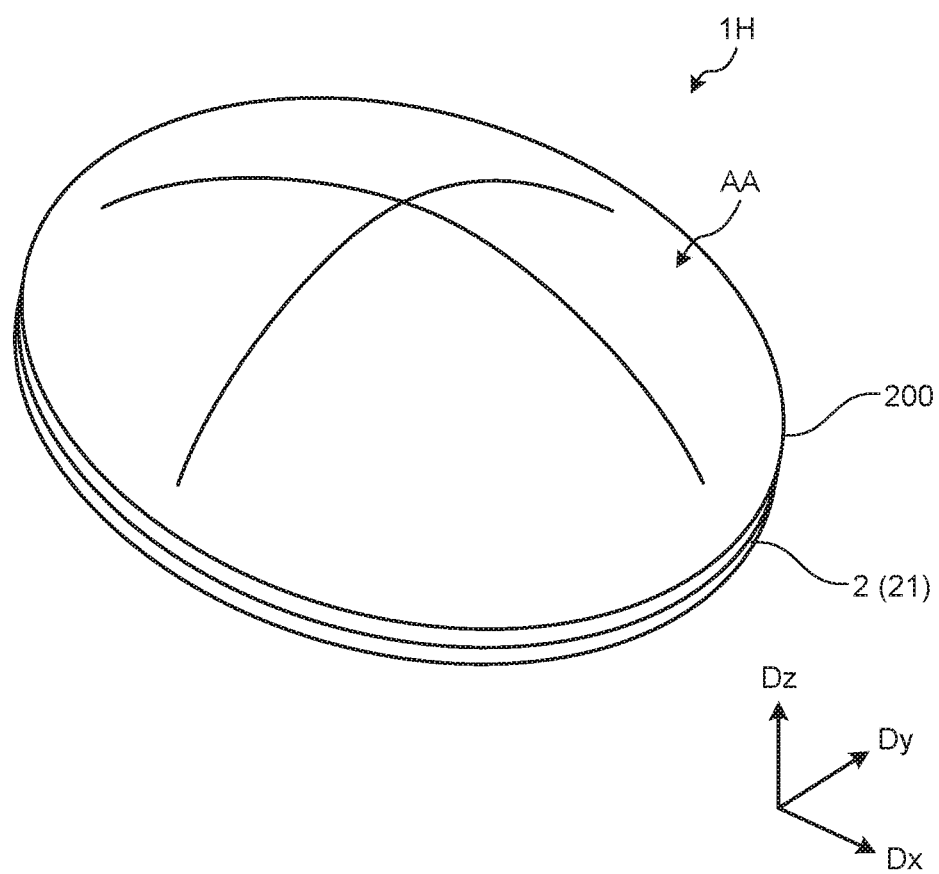
FIG. 15 is a perspective view schematically illustrating a display device of a fourth embodiment.

FIG. 15 is a perspective view schematically illustrating a display device of a fourth embodiment. In the first modification to the fifth modification and the third embodiment described above, the cross-sectional structure of the substrate 21 cut along the first direction Dx has a curved shape.

The cross-sectional structure of the substrate 21 in the second direction Dy is formed flat. More specifically, the cross-sectional structure of the substrate 21 in the first direction Dx indicates a cross-sectional structure of the substrate 21 cut by a plane defined by the first direction Dx and the third direction Dz.

As illustrated in FIG. 15, a display device 1H of the fourth embodiment has the display region AA formed in a spherical shape. In other words, the cross-sectional structure of the array substrate 2 (substrate 21) of the display device 1H in the first direction Dx has a curved shape formed in a convex shape, and the cross-sectional structure of the array substrate 2 in the second direction Dy intersecting with the first direction Dx also has a curved shape formed in a convex shape.

In the present embodiment also, the configuration of the embodiments and modifications described above may be used. In the present embodiment, it is possible to change the height positions and inclination angles of the light emitting elements 3 disposed in the first direction Dx, and change the height positions and inclination angles of the light emitting elements 3 disposed in the direction intersecting with the first direction Dx (for example, the second direction Dy).

For example, it is possible to improve the luminance of the center portion of the display region AA, by arranging the light emitting elements 3, which are arranged along the periphery of the display region AA, in an inclined manner toward the center portion side of the display region AA. Alternatively, it is possible to improve the viewing angle in all directions of the display region AA, by arranging the light emitting elements 3, which are arranged along the periphery of the display region AA, in an inclined manner toward the outside of the display region AA (end portion side of the substrate 21).

In this manner, preferred embodiments of the present disclosure have been described. However, the present disclosure is not limited to such embodiments. What have been described in the embodiments are merely examples, and various modifications may be made without departing from the spirit and scope of the present disclosure. Appropriate modifications coming within the spirit and scope of the present disclosure naturally belongs to the technical scope of the present disclosure. At least one of various omissions, replacements, and changes of the components can be made without departing from the scope of the embodiments and modifications described above.

What is claimed is:

1. A display device, comprising:
a substrate;
a plurality of pixels provided on the substrate;
a plurality of light emitting elements provided in each of the pixels;
a transistor provided corresponding to the light emitting elements;
an insulation film provided on the transistor; and
a mounting electrode provided on the insulation film and to which the light emitting element is coupled, wherein
a first distance between a top surface of the substrate and one of the light emitting elements in a direction perpendicular to the top surface of the substrate, in a center portion of a display region of the substrate, is different from a second distance between the top surface of the substrate and another one of the light emitting elements in the direction perpendicular to the top surface of the substrate, in a periphery portion of the display region, and
thickness of the insulation film in the center portion of the display region of the substrate is different from thickness of the insulation film in the periphery portion of the display region.

2. The display device according to claim 1, wherein the first distance is greater than the second distance.

3. The display device according to claim 1, wherein the second distance is greater than the first distance.

4. The display device according to claim 1, wherein
the light emitting elements are disposed in a first direction, and
a distance between the top surface of the substrate and the one of the light emitting elements in the center portion is different from a distance between the top surface of the substrate and the other one of the light emitting elements in the periphery portion away from the center portion in the first direction.

5. The display device according to claim 1, wherein
the light emitting elements are disposed in a first direction, and
each distance between the top surface of the substrate and the light emitting elements in a direction perpendicular to the top surface of the substrate changes continuously from the center portion toward the periphery portion in the first direction.

6. The display device according to claim 1, wherein an absolute value of a second insulation film angle formed by a direction parallel to the top surface of the substrate and a top surface of the insulation film, in the periphery portion of the display region of the substrate, is greater than an absolute value of a first insulation film angle formed by the direction parallel to the top surface of the substrate and the top surface of the insulation film, in the center portion of the display region.

7. The display device according to claim 1, wherein the substrate is formed in a flat shape.

8. The display device according to claim 1, wherein the substrate has a first surface on which the light emitting element is mounted and a second surface on a side opposite to the first surface, and is formed in a curved shape such that the first surface has a convex shape.

9. The display device according to claim 1, wherein the substrate has a first surface on which the light emitting elements are mounted and a second surface on a side opposite to the first surface, and is formed in a curved shape such that the first surface has a concave shape.

10. A display device, comprising:
a substrate;
a plurality of pixels provided on the substrate;
a plurality of light emitting elements provided in each of the pixels;
a transistor provided corresponding to the light emitting elements;
an insulation film provided on the transistor; and
a mounting electrode provided on the insulation film and to which the light emitting element is coupled, wherein
an absolute value of a second angle formed by a direction parallel to a top surface of the substrate and a bottom surface of one of the light emitting elements, in a periphery portion of a display region of the substrate, is greater than an absolute value of a first angle formed by the direction parallel to the top surface of the substrate and a bottom surface of another one of the light emitting elements, in a center portion of the display region, and thickness of the insulation film in the center portion of the display region of the substrate is different from thickness of the insulation film in the periphery portion of the display region.

11. The display device according to claim 10, wherein in the periphery portion of the display region, a bottom surface of the light emitting element at an end portion side of the substrate is inclined in a direction away from the substrate, with respect to the bottom surface of the light emitting element at a center portion side of the substrate.

12. The display device according to claim 10, wherein in the periphery portion of the display region, a bottom surface of the light emitting elements at a center portion side of the substrate is inclined in a direction away from the substrate, with respect to the bottom surface of the light emitting element at an end portion side of the substrate.

13. The display device according to claim 10, wherein
the light emitting elements are disposed in a first direction, and
each inclination angle of the light emitting elements changes continuously from the center portion toward the periphery portion in the first direction.

14. The display device according to claim 10, wherein
an absolute value of a second insulation film angle formed by a direction parallel to the top surface of the substrate and a top surface of the insulation film, in the periphery portion of the display region of the substrate, is greater than an absolute value of a first insulation film angle formed by the direction parallel to the top surface of the substrate and the top surface of the insulation film, in the center portion of the display region.

15. The display device according to claim 10, wherein
the substrate has a first surface on which the light emitting element is mounted and a second surface on a side opposite to the first surface, and is formed in a curved shape such that the first surface has a convex shape.

16. The display device according to claim 10, wherein
the substrate has a first surface on which the light emitting elements are mounted and a second surface on a side opposite to the first surface, and is formed in a curved shape such that the first surface has a concave shape.

* * * * *